United States Patent
Cohen et al.

[11] 3,932,184
[45] Jan. 13, 1976

[54] FABRICATION OF MICROLENSES

[75] Inventors: Leonard George Cohen, Matawan; Martin Victor Schneider, Holmdel, both of N.J.

[73] Assignee: Bell Telephone Laboratories, Incorporated, Murray Hill, N.J.

[22] Filed: May 29, 1973

[21] Appl. No.: 364,501

[52] U.S. Cl. .................. 96/38.3; 96/35.1; 96/36; 156/8; 156/15
[51] Int. Cl.² .................... G03C 5/00; G03C 11/00
[58] Field of Search .......... 96/38.3, 36, 35.1; 156/8, 156/15

[56] References Cited
UNITED STATES PATENTS

| | | | |
|---|---|---|---|
| 3,658,528 | 4/1972 | Berman et al. | 96/38.3 |
| 3,771,983 | 11/1973 | Straka | 156/15 |

*Primary Examiner*—Edward C. Kimlin
*Attorney, Agent, or Firm*—L. C. Canepa

[57] ABSTRACT

Photolithographic techniques are employed to fabricate hemispherical or semicylindrical microlenses on the end surfaces of optical fibers. The power coupling efficiency between junction lasers and fibers is thereby significantly increased.

5 Claims, 5 Drawing Figures

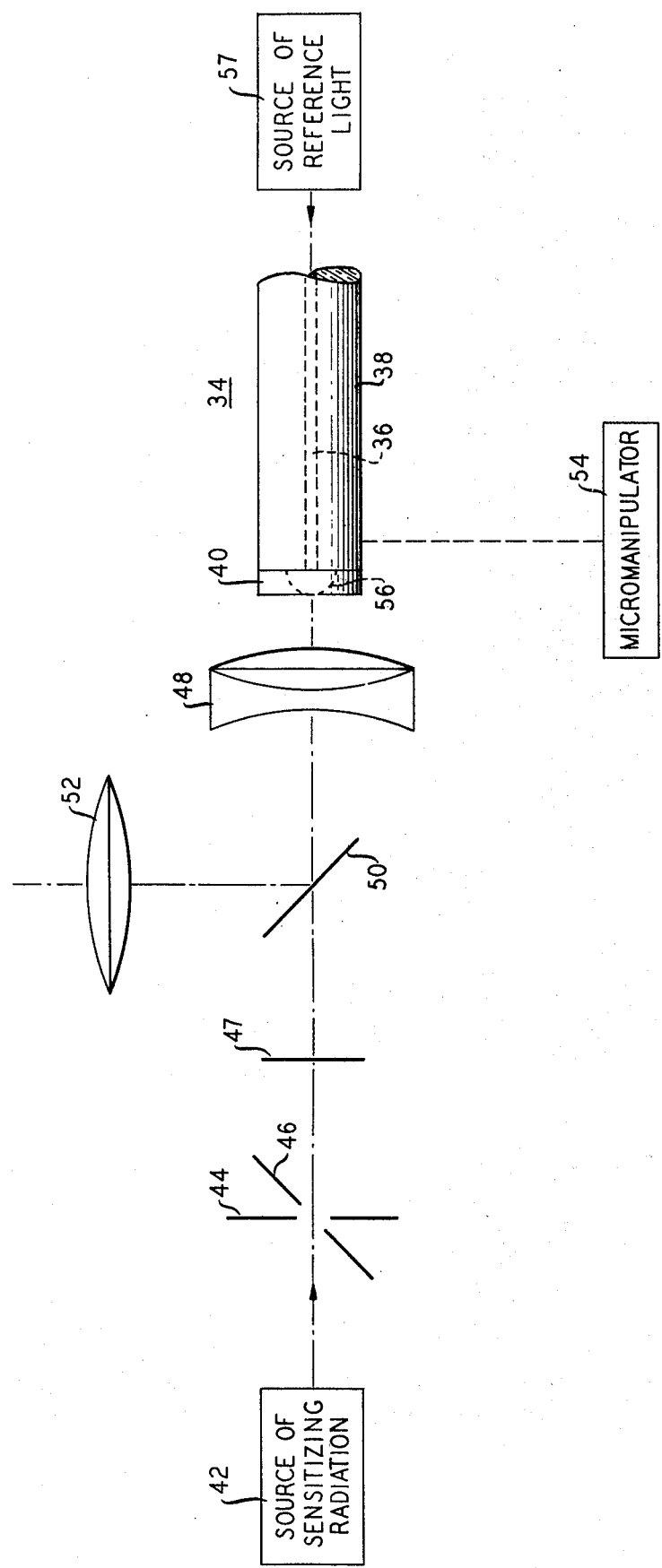

3,932,184

FABRICATION OF MICROLENSES

BACKGROUND OF THE INVENTION

This invention relates to photolithographic techniques and more particularly to the use of such techniques for fabricating so-called microlenses.

The problem of efficiently coupling light from gallium arsenide injection lasers of stripe geometry into the cores of optical fibers is an important one whose solution is being actively sought. By carefully aligning the fiber core with respect to the stripe and by optimizing the air gap spacing between the laser and the fiber, efficiencies of about 8 percent have been achieved.

In "Power Coupling from GaAs Injection Laser into Optical Fibers" by L. G. Cohen, The Bell System Technical Journal, Vol. 51, (March 1972), pages 573–594, the use of a semicylindrical lens is proposed for increasing the power coupling efficiency between a gallium arsenide laser and an optical fiber. The only technique suggested in the cited article for fabricating the lens involves grinding an unclad cylindrical fiber in half.

Lenses with diameters and thicknesses on the order of a few micrometers ($\mu$m), hereinafter referred to as microlenses, are required to optimize the aforementioned laser-to-fiber coupling efficiency. Such very small lenses cannot easily and accurately be fabricated by conventional polishing or molding techniques. Moreover, the handling, mounting and alignment of discrete microlenses in a laser-to-fiber system present formidable practical problems.

SUMMARY OF THE INVENTION

Accordingly, an object of the present invention is an improved way of making very small lenses.

More specifically, an object of this invention is to provide photolithographic techniques for fabricating microlenses for use in a laser-to-fiber system.

Briefly, these and other objects of the present invention are realized in a specific illustrative process in which microlenses are fabricated in place in a laser-to-fiber system by photolithographic techniques. The fabrication process involves initially depositing a thin film of a suitable light-sensitive material on the flat entry face of a length of cladded optical fiber. The material is then exposed to sensitizing radiation that alters the structure of selected portions of the material. To make a hemispherical microlens, the sensitizing radiation is directed into the far end of the fiber and propagated along the core toward the entry face to impinge on the back surface of the deposited material. To make a semicylindrical microlens, successively wider stripes of sensitizing radiation are propagated onto the front surface of the deposited material.

BRIEF DESCRIPTION OF THE DRAWING

A complete understanding of the present invention and of the above and other objects thereof may be gained from a consideration of the following detailed description of several specific illustrative processes presented hereinbelow in connection with the accompanying drawing in which:

FIG. 3 illustrates the technique utilized to form a semicylindrical microlens.

DETAILED DESCRIPTION

Figure 1:
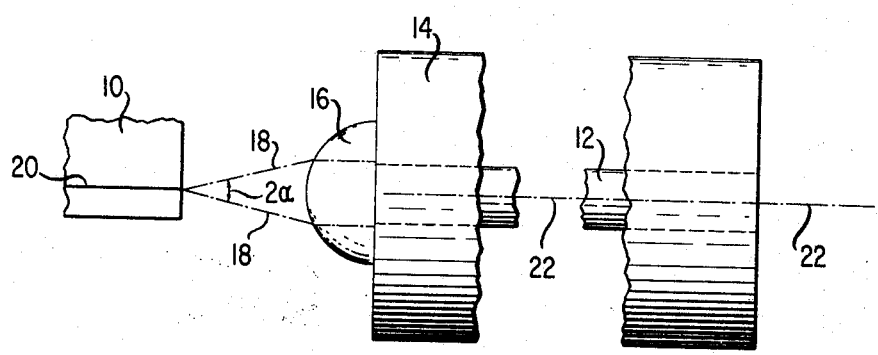
FIG. 1 depicts a laser-to-fiber coupling system that includes a microlens made in accordance with the principles of the present invention.

In FIG. 1 the light power emanating from the rectangular aperture of a conventional gallium arsenide junction laser 10 of stripe geometry is directed at the core 12 of a conventional single-mode optical fiber having a cladding 14. To convert the strongly astigmatic laser beam ($\lambda$=9000 Angstrom units) to a beam that more closely matches the circular $HE_{11}$ mode of the fiber core 12, a microlens 16 is utilized.

Illustratively, the cladding 14 of the fiber shown in FIG. 1 is made of fused silica and the core 12 thereof is made of suitably doped fused silica. As is well known in the art, the core of such a fiber exhibits a slightly higher index of refraction than that of the cladding. An illustrative fiber of this type, wherein the dopant is a multivalent metal oxide, is described in R. D. Maurer et al. U.S. Pat. No. 3,659,915, issued May 2, 1972. It is to be emphasized, however, that a variety of other known and conventional glass materials systems are suitable for forming a fiber to be used in carrying out the process of the present invention. Other such suitable materials are described, for example, in "Low-Loss Glass Fibers for Optical Transmission" by A. D. Pearson and W. G. French, Bell Laboratories Record, April 1972, pp. 103–109, which subject is glass fiber waveguides, which according to the authors, "consist of a cylindrical core of optically transparent material having a relatively high index of refraction, clad with a layer of optical material having a lower refractive index . . . . the principles of total internal reflection operate on light launched into the core; such light will be guided along the length of the compound fiber."

Light rays coupled from the laser 10 to the core 12 via the microlens 16 are represented in FIG. 1 by dashed lines 18. These rays emanate from junction 20 of the laser 10. The junction, which lies in a plane that is perpendicular to the plane of the drawing sheet, provides an elliptical or rectangular Gaussian beam typical dimensions 0.6 by 5 $\mu$m) that diverges much more rapidly perpendicular to the junction plane than it does parallel to the junction plane.

One specific illustrative fiber suitable for inclusion in a system of the type shown in FIG. 1 is made of quartz with a core diameter of 4 $\mu$m and a cladding diameter of 250 $\mu$m. The dimensions of the requisite associated microlens 16 are obtained to a first approximation by using simple ray analysis. For example, for a lens material having an index of refraction $n$ =1.6, a 6.5-$\mu$m-diameter lens is needed to collimate a laser beam that diverges at $\alpha$ = 30° from the junction plane (see FIG. 1).

The element 16 represented in FIG. 1 may be either a hemispherical or a semicylindrical microlens. In either case the first step in fabricating the element 16 is to prepare the left-hand or entry face of the depicted optical fiber to be flat and to lie in a plane that is perpendicular to the main longitudinal axis 22 of the fiber. This may be accomplished, for example, simply by clamping the fiber in a jig, scoring the surface thereof with a diamond blade and then applying a longitudinal force to separate the fiber at the score. In practice, this simple procedure is usually adequate to prepare the entry face of the fiber in a satisfactory manner without any further processing. If, however, deviations from flatness or from perpendicularity from the axis 22 are observed, these can be easily corrected by grinding the entry face.

A newly cut entry face on an optical fiber usually does not need cleaning. If, however, cleaning of the face is required, suitable materials therefor are trichlorethylene, xylene or photoresist strippers, which are conventional cleaning agents.

Subsequently, the entire entry face (both core and cladding) of the prepared fiber end is coated with a layer of a light-sensitive material. This is accomplished by dipping the end into the material, by spraying, or otherwise depositing the material onto the end in any known way. A layer of the material several micrometers thick is thereby applied to the entry face.

The material deposited on the entry face of the fiber may comprise any one of a variety of known negative photoresists. Various negative photoresists comprising, for example, monomeric and cross-linkable polymeric compounds and elements are well known. Illustratively, addition polymers of the type described in U.S. Pat. Nos. 3,418,295 and 3,469,982, issued Dec. 24, 1968 and Sept. 30, 1969, respectively, are suitable for use as negative photoresists. Another example of a standard such negative photoresist suitable for utilization in the process described herein is cyclized-cis-polyisoprene combined with a diazido compound such as 2, 6-bis (p-azidobenzal)-4-methylcyclo hexanone and a solvent. Still other standard negative photoresists known in the art and suitable for use in the process described herein are disclosed in U.S. Pat. Nos. 3,520,683, 3,623,870 and 3,674,492, issued July 14, 1970, Nov. 30, 1971 and July 4, 1972, respectively.

Illustratively, the material deposited on the entry face of the fiber comprises a photosensitive polymer which has an index of refraction $n = 1.6$ and which is transparent to radiation at 9000 Angstrom units. Examples thereof suitable for utilization in the process described herein are an undiluted photoresist designated Micronegative Resist, manufactured by Eastman Kodak Company, Rochester, New York, or an undiluted photoresist designated Waycoat IC made by Philip A. Hunt Chemical Corporation, Palisades Park, New Jersey. Exposure to ultraviolet light causes the exposed portions of these materials to form a crosslinked molecular structure that is resistant to subsequent steps employed to remove the unexposed photoresist. Moreover, such crosslinked structures do not oxidize and do not absorb moisture to any significant extent. Nor are any other significant degradational mechanisms known to exist in such structures under normal atmospheric conditions.

Before exposing the deposited light-sensitive material to ultraviolet radiation, it is advantageous to prebake the material to remove solvents and impurities therefrom. This is done, for example, by baking the material for about 20 minutes at 80° C.

Subsequent to the prebaking step, the coated fiber end is selectively exposed to sensitizing radiation in accordance with the principles of the present invention thereby to form a centrally positioned microlens on the fiber end.

Figure 2:
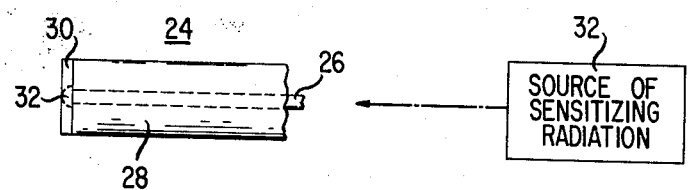
FIG. 2 represents the technique employed to form a hemispherical microlens.

An illustrative arrangement utilized to fabricate a hemispherical microlens on a fiber end is shown in FIG. 2. Fiber 24, including a 4-$\mu$m-diameter core 26 and a 250-$\mu$m-diameter cladding 28, has a 2–3-$\mu$m-thick layer 30 of a light-sensitive material deposited on the left-hand or entry face of the fiber. A source 32, which comprises, for example, a mercury arc lamp, is positioned near the right-hand end of the fiber 24 to direct sensitizing radiaton along the core 26 to impinge upon the back or right-hand surface of the layer 30. The ultraviolet output of the source 32 (whose wavelength approximates 3000–5000 Angstrom units) is effective to cause crosslinking of the molecules of the layer 30 in the immediate vicinity of the core 26.

In a system of the type shown in FIG. 2 some of the incident ultraviolet radiation from the source 32 may penetrate into the cladding 28. To minimize the amount of such penetrating radiation that reaches the left-hand end of the fiber 24, an index-matching material such as glycerine may be coated on a portion of the outer surface of the fiber. As a result of such a coating, penetrating radiation will be scattered out of the fiber via the coating into the medium surrounding the fiber. Accordingly, the ultraviolet radiation that actually reaches the left-hand end of the fiber 24 is automatically confined to the core area and the immediate vicinity thereof.

Moreover, the dimensions of the exposed portion of the layer 30 of FIG. 2 are a function of the product of the intensity of the sensitizing ultraviolet radiation and of the exposure time. For a light intensity of approximately 0.3 mW/cm$^2$, a 4-$\mu$m-wide by 2–3-$\mu$m-thick exposed section was obtained for an exposure time of 3 minutes; a 7-$\mu$m-wide by 2–3-$\mu$m-thick exposed section was obtained for an exposure time of 10 minutes and a 14-$\mu$m-wide by 2–3-$\mu$m-thick section was obtained for 25 minutes of exposure. Other lens thicknesses are obtained by first exposing a uniform layer of photoresist over the entire fiber end and then exposing an additional layer as described above.

Because the ultraviolet light supplied by the source 32 of FIG. 2 is confined almost entirely to the core 26 and due to the fact that the intensity of the exposing light has a nearly Gaussian profile, the exposed portion of the layer 30 is limited to the core area and its immediate vicinity. This exposed portion has a generally hemispherical shape (with slight ridging).

After exposure of the layer 30 as described above, the fiber end including the layer 30 is immersed in a developer (for example, in Kodak Micronegative Resist Developer made by Eastman Kodak Company) for about 20 seconds. This is followed by a rinse (for example, in Kodak Micronegative Resist Rinse made by Eastman Kodak Company) for approximately 20 seconds. At that point all of the layer, except the exposed and developed hemispherically shaped portion covering the core 26, has been removed from the left-hand end of the fiber 24. This remaining portion is designated 31 in FIG. 2.

A variety of developers and rinses suitable for use in carrying out the process described herein is known in the art. Illustrative such materials are specified, for example, in the aforecited U.S. Pat. Nos. 3,520,683 and 3,674,492.

The fiber end shown in FIG. 2, with the portion 31 remaining thereon, is then baked for about 30 minutes at approximtely 130° C to harden the exposed and developed material. In this baking step the material of the portion 31 flows slightly. As a result, the surface of the portion is smoothed to form a high quality ridgeless hemispherical microlens. In an actual laser-to-fiber system, such a microlens formed on the end of the fiber was effective to achieve a power coupling efficiency of about 23 percent.

Figure 4:
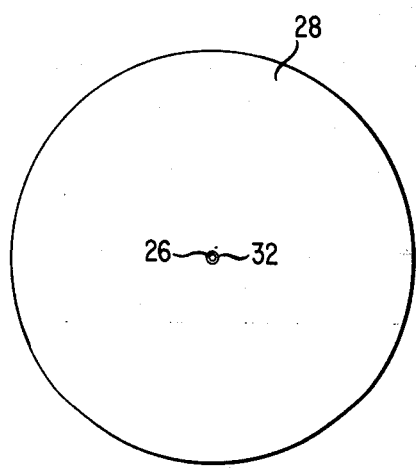
FIGS. 4 and 5 are representations drawn approximately to scale showing a hemispherical microlens and a semicylindrical microlens formed on the end faces of two single-mode optical fibers.

Because neither FIG. 1 nor FIG. 2 is drawn to scale, FIG. 2 has been included to emphasize the subminiature size of the lens formed by the method described above. FIG. 4 is a schematic representation drawn approximately to scale of scanning electron photomicrographs of an actual hemispherical microlens having a diameter of approximately 6.4 $\mu$m and a thickness of about 2.5 $\mu$m formed on the end surface of a single-mode optical fiber. The depicted fiber has a 4-$\mu$m-diameter core 26 and a 250-$\mu$m-diameter cladding 28.

FIG. 3 shows an illustrative arrangement utilized to fabricate a semicylindrical microlens on a fiber end in accordance with the principles of the present invention. Fiber 34, including a 4-$\mu$m-diameter core 36 and a 250-$\mu$m-diameter cladding 38, has a 2–3-$\mu$m-thick layer 40 of a light-sensitive material deposited on the left-hand or entry face of the fiber. Advantageously the layer 40 is initially prebaked as described above.

In forming a semicylindrical microlens in the layer 40 of FIG. 3, a source 42 of sensitizing radiation is utilized. The source 42 is, for example, a mercury arc lamp that supplies an ultraviolet output. Two apertured plates 44 and 46 with orthogonally disposed slits are positioned in the path of the radiation supplied by the source 42 to form an elliptical or rectangular shaped beam approximately 180 $\mu$m wide by 500 $\mu$m high. In turn, the beam is projected onto the left-hand or front surface of the layer 40 by a 20X reduction lens 48. Advantageously, for the reason specified below, the incident beam is focused slightly in front of the front surface of the layer 40.

A beam splitter 50 and an eyepiece 52 are included in the FIG. 3 arrangement to permit an operator to view the position of the projected beam on the layer 40. By means of a micromanipulator 54 attached to the fiber 34, the fiber is moved to position the elliptical or rectangular shaped beam in a central location directly over the core 36 of the fiber. To provide a reference spot for aligning the rectangular beam, another source 57 is positioned to illuminate the core with light to which the material of the layer 40 is not sensitive. During the alignment process, a filter 47 is interposed in the path of the light provided by the source 42 to block sensitizing radiation from reaching the front surface of the layer 40 but to allow nonsensitizing light to impinge thereupon.

After alignment, the aforementioned filter 47 is removed and the beam of ultraviolet light supplied by the source 42 causes exposure of a centrally positioned stripe of the material of the layer 40. In order to control the contour of the exposed material, the layer 40 is advantageously exposed in, for example, three steps with exposure times of, for instance, 10 seconds, 20 seconds and 30 seconds, respectively, using successively wider ultraviolet stripes. Because of the successive-exposure process and due to diffraction effects (stemming from the aforementioned focusing of the beam slightly in front of the layer 40), the exposed portion of the layer exhibits a generally semicylindrical shape (with a slightly stepped contour).

Subsequently, the exposed portion 56 of the layer 40 of FIG. 3 is developed and the unexposed portion removed in accordance with the same techniques described above in connection with fabrication of hemispherical microlenses. Then, in a baking step the exposed and developed portion is caused to flow slightly, thereby to form a hard smoothly contoured semicylindrical microlens. Such a microlens was effective to achieve a power coupling efficiency of about 34 percent in a laser-to-fiber system.

Figure 5:
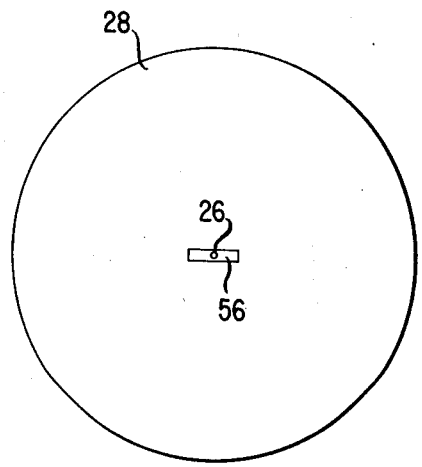

FIG. 5 is an approximate scale drawing based on scanning electron photomicrographs of an actual semicylindrical microlens 56. The microlens was 35 $\mu$m wide, 7 $\mu$m high and 3 $\mu$m thick and was positioned directly over the core 26 and over minor adjacent portions of the cladding 28.

The quality of microlenses made in accordance with the principles of the present invention can be tested by directing light onto one end of a fiber having a microlens formed on the other end. In one such test, light from a laser was directed into the one end. A 40X microscope objective lens was spaced apart from the other end of the fiber to image the focal plane of the microlens onto a frosted plate. The image on the frosted plate was then magnified and photographed.

By the aforementioned test procedure it was determined that a typical hemispherical microlens made as described herein reduced the diameter of the circular $HE_{11}$ fiber mode by a factor of 3. In accordance with the same procedure, it was determined that a typical semicylindrical microlens made as described above transformed the fiber's circular $HE_{11}$ mode to an elliptical image with a 4:1 aspect ratio.

Even greater coupling efficiencies may be achieved in a laser-to-fiber system of the type described herein by combining a hemispherical microlens formed on the fiber end with a semicylindrical microlens formed over the rectangular light emitting region of the laser. Such microlenses may be made in accordance with the respective procedures described above. Alternatively, the semicylindrical element on the laser may be formed by having the rectangular laser beam itself selectively expose photoresist deposited on the output face of the laser. Due to the elliptical or rectangular nature of the laser beam and its generally Gaussian profile, a semicylindrical contoured microlens may be formed if heat generated by the laser is sufficient to sensitize the photoresist.

Finally, it is to be understood that the above described methods are only illustrative of the application of the principles of the present invention. In accordance with these principles, numerous other techniques may be devised by those skilled in the art without departing from the spirit and scope of the invention.

What is claimed is:

1. A method for forming a microlens on one end surface of an optical fiber that comprises a relatively high index-of-refraction cylindrical core having a relatively low index-of-refraction cladding disposed thereabout, said method comprising the steps of:
    coating the entire surface of said one end of said fiber with a negative transparent photoresist material,
    exposing to radiation only a selected portion of the material coated on said end surface by directing at said material a radiant beam whose cross-sectional area approximates that of said core and is much less than the cross-sectional area of said core and cladding, said selected portion including the material that covers the entire core area of the fiber but excludes the major portion of the material that covers the cladding of the fiber,
    removing the unexposed portion of said material, and baking said remaining exposed portion to cause it to flow slightly, thereby to harden said exposed portion and to smooth the contour thereof.

2. A method as in claim 1 wherein said exposing step comprises directing radiation into the other end of said fiber to propagate along said core to impinge on the rear surface of said material only in the area overlying said core and the immediate vicinity thereof.

3. A method as in claim 1 wherein said exposing step comprises:

during a first interval of time directing a rectangular beam of radiation to impinge on the front surface of said material in a centrally positioned location overlying said core, the cross-sectional area of said beam being much less than the cross-sectional area of said core and cladding, and during a second interval of time directing a wider rectangular beam of sensitizing light to impinge on the front surface of said material in a centrally positioned location overlying said core, the cross-sectional area of said wider beam being much less than the cross-sectional area of said core and cladding and substantially encompassing within it the cross-sectional area of said first-recited rectangular beam.

4. A method as in claim 3 wherein said exposing step includes focusing each of said beams in a plane that is spaced in front of said front surface.

5. A method as in claim 4 wherein said exposing step is preceded by the step of directing nonsensitizing light into the other end of the said fiber to illuminate the core at said one end to provide a reference spot for aligning said rectangular beams in said centrally positioned location.

* * * * *